US006787990B2

(12) United States Patent
Cok (10) Patent No.: US 6,787,990 B2
(45) Date of Patent: Sep. 7, 2004

(54) OLED AREA ILLUMINATION LIGHT SOURCE HAVING FLEXIBLE SUBSTRATE ON A SUPPORT

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/156,494

(22) Filed: May 28, 2002

(65) Prior Publication Data

US 2003/0222578 A1 Dec. 4, 2003

(51) Int. Cl.$^7$ ................................................ H01R 33/00
(52) U.S. Cl. ...................... 313/504; 313/512; 313/499; 362/226; 362/249
(58) Field of Search ........................... 313/504–505, 313/512, 499; 362/226, 249; 257/51.049; 439/377; 427/66

(56) References Cited

U.S. PATENT DOCUMENTS

| | | | | |
|---|---|---|---|---|
| 4,138,620 A | * | 2/1979 | Dickson ........................... 313/1 |
| 4,211,955 A | * | 7/1980 | Ray ................................ 315/53 |
| 4,745,334 A | * | 5/1988 | Kawachi ........................ 313/512 |
| 4,769,292 A | | 9/1988 | Tang et al. |
| 4,987,340 A | * | 1/1991 | Yoshioka ....................... 313/512 |
| 5,061,569 A | | 10/1991 | VanSlyke et al. |
| 5,266,865 A | * | 11/1993 | Haizumi et al. ............... 313/506 |
| 5,300,858 A | * | 4/1994 | Nikaido ......................... 313/503 |
| 5,667,394 A | | 9/1997 | Chien |
| 5,844,362 A | * | 12/1998 | Tanabe et al. ................. 313/506 |
| 5,950,808 A | * | 9/1999 | Tanabe et al. ................. 200/314 |
| 6,010,742 A | * | 1/2000 | Tanabe et al. .................. 427/66 |
| 6,036,336 A | * | 3/2000 | Wu ................................ 362/249 |
| 6,124,672 A | * | 9/2000 | Burke ........................... 313/506 |
| 6,218,785 B1 | * | 4/2001 | Incerti ........................... 315/185 S |
| 6,225,741 B1 | * | 5/2001 | Nakamura et al. ............ 313/506 |
| 6,274,978 B1 | | 8/2001 | Roach et al. |
| 6,515,314 B1 | * | 2/2003 | Duggal et al. ................. 257/184 |
| 6,565,231 B1 | * | 5/2003 | Cok ............................... 362/226 |

FOREIGN PATENT DOCUMENTS

| | | |
|---|---|---|
| EP | 0 949 850 A1 | 10/1999 |
| EP | 1 120 838 A2 | 8/2001 |
| WO | 99/57945 | 11/1999 |

OTHER PUBLICATIONS

Internet Article: Bergh et al., The Promise and Challenge of Solid–State Lighting, *Physics Today online*, Dec. 2001, pp. 1–9.

* cited by examiner

*Primary Examiner*—Nimeshkumar D. Patel
*Assistant Examiner*—Dalei Dong
(74) *Attorney, Agent, or Firm*—Thomas H. Close; Andrew J. Anderson (57) ABSTRACT

A solid-state area illumination light source includes a rigid support; a flexible substrate attached to the rigid support; an organic light emitting diode (OLED) layer deposited on the flexible substrate, the organic light emitting diode layer including first and second electrodes for providing electrical power to the OLED layer; an encapsulating cover covering the OLED layer, first and second conductors electrically connected to the first and second electrodes, and extending beyond the encapsulating cover for making electrical contact to the first and second electrodes by an external power source; and a base connected to the rigid support, the base being adapted to be removably received by a socket and having first electrical contacts for making electrical connection to the first and second conductors of the light source, and second electrical contacts for making electrical connection to conductors in the socket.

27 Claims, 9 Drawing Sheets

OLED AREA ILLUMINATION LIGHT SOURCE HAVING FLEXIBLE SUBSTRATE ON A SUPPORT

FIELD OF THE INVENTION

The present invention relates to the use of organic light emitting diodes for area illumination.

BACKGROUND OF THE INVENTION

Solid-state lighting devices made of light emitting diodes are increasingly useful for applications requiring robustness and long-life. For example, solid-state LEDs are found today in automotive applications. These devices are typically formed by combining multiple, small LED devices providing a point light source into a single module together with glass lenses suitably designed to control the light as is desired for a particular application (see, for example WO99/57945, published Nov. 11, 1999). These multiple devices are expensive and complex to manufacture and integrate into single area illumination devices. Moreover, LED devices provide point sources of light that are not preferred for area illumination.

It is known to manufacture an OLED light source or display device on a flexible substrate. See for example EP0949850 A1, published Oct. 13, 1999 that shows a substrate comprising a laminated substrate of plastic and glass. The manufacture of the OLED device on a flexible substrate facilitates continuous manufacture, wherein the substrate can be supplied as a web in a roll.

It is also useful if a lighting device is compatible with existing lighting infrastructure, for example the common screw-type base (standard E26) and the pin-type bayonet base (standard B22). Moreover, the lighting devices are preferably readily and safely replaced by consumers at minimal cost.

There is a need therefore for an improved, replaceable OLED area illumination device having a simple construction using a single substrate, is compatible with the existing lighting infrastructure and can be provided in a variety of two and three-dimensional shapes.

SUMMARY OF THE INVENTION

The need is met by providing a solid-state area illumination light source that includes a rigid support; a flexible substrate attached to the rigid support; an organic light emitting diode (OLED) layer deposited on the flexible substrate, the organic light emitting diode layer including first and second electrodes for providing electrical power to the OLED layer, an encapsulating cover covering the OLED layer; first and second conductors electrically connected to the first and second electrodes, and extending beyond the encapsulating cover for making electrical contact to the first and second electrodes by an external power source; and a base connected to the rigid support, the base being adapted to be removably received by a socket and having first electrical contacts for making electrical connection to the first and second conductors of the light source, and second electrical contacts for making electrical connection to conductors in the socket.

ADVANTAGES

The present invention has the advantage of providing an OLED light source that can be shipped and stored in a convenient flat configuration and deployed and used in a variety of three dimensional configurations.

It will be understood that the figures are not to scale since the individual layers are too thin and the thickness differences of various layers too great to permit depiction to scale.

DETAILED DESCRIPTION OF THE INVENTION

Figure 1:
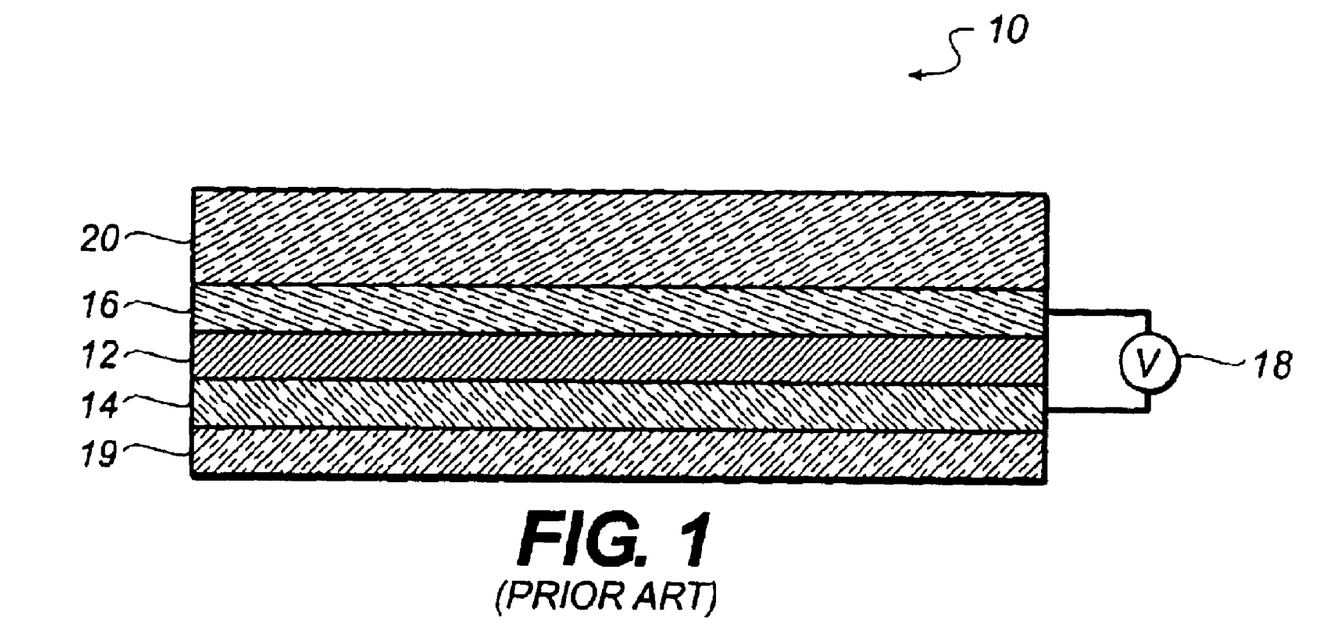
FIG. 1 illustrates a partial cross section of a prior art OLED area illumination light source.

FIG. 1 is a schematic diagram of a prior art OLED light source including an organic light emitting layer 12 disposed between two electrodes, e.g. a cathode 14 and an anode 16. The organic light emitting layer 12 emits light upon application of a voltage from a power source 18 across the electrodes. The OLED light source 10 typically includes a substrate 20 such as glass or plastic. It will be understood that the relative locations of the anode 16 and cathode 14 may be reversed with respect to the substrate. The term OLED light source refers to the combination of the organic light emitting layer 12, the cathode 14, the anode 16, and other layers and other layers and supports described below.

Figure 2:
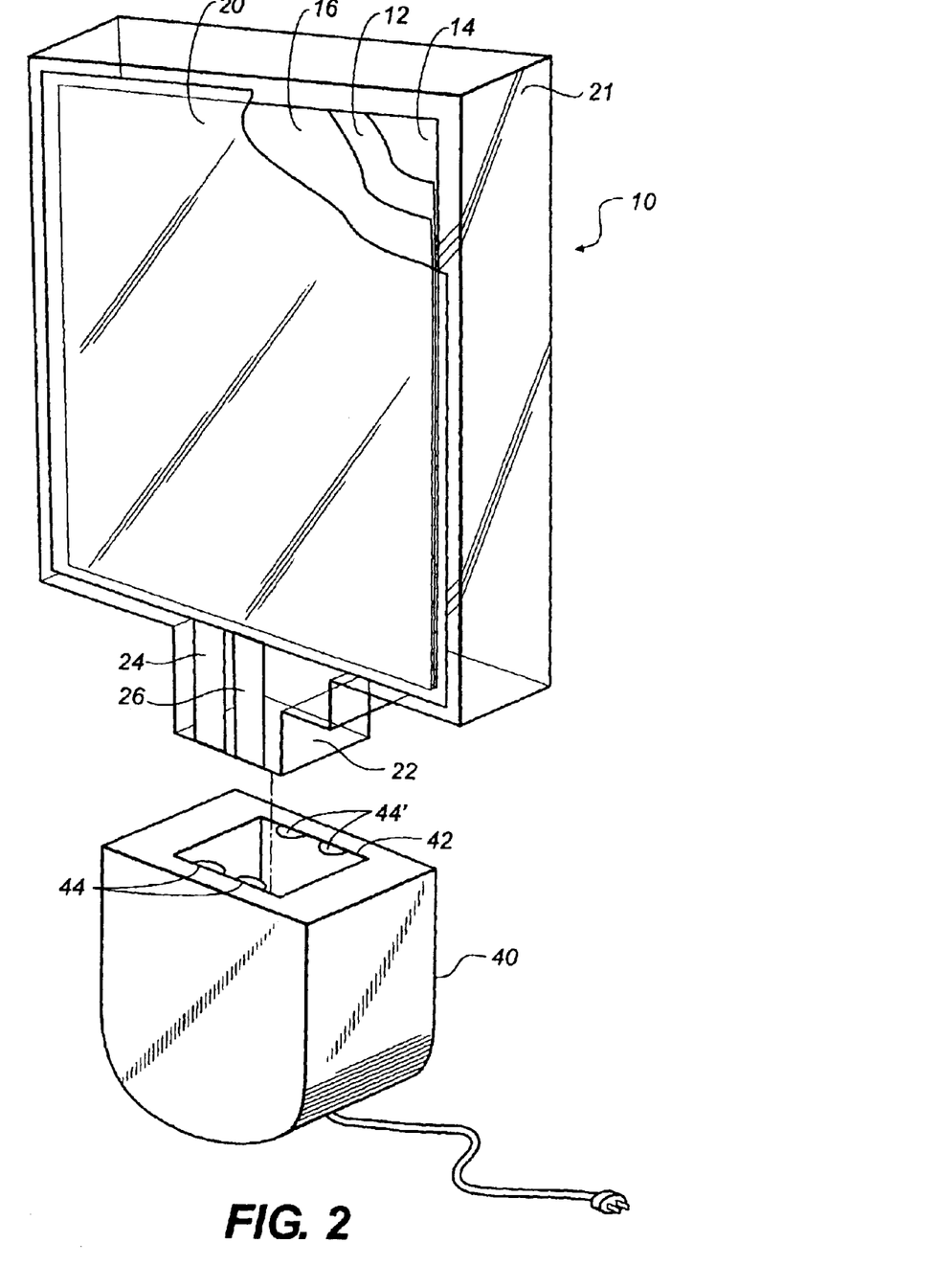
FIG. 2 is a perspective view of a light source according to one embodiment of the present invention and a socket for receiving the light source.

Referring to FIG. 2, according to one embodiment of the present invention, the solid-state area illumination OLED light source 10, includes an OLED layer on a flexible transparent substrate 20 attached to a rigid planar support 21. An organic light emitting diode (OLED) layer 12 is located on the transparent substrate 20 between a transparent cathode 14 and a transparent anode 16 for providing electrical power to the OLED layer 12. In one embodiment, the OLED layer does not extend to the edges of the flexible substrate 20. The flexible substrate is attached to the rigid support with the OLED layer between the flexible substrate and the rigid support, and the flexible substrate is attached to the rigid support 21, for example by an hermetic adhesive, such that the rigid support acts as an encapsulating cover to protect the OLED layer from moisture.

The OLED layer is continuous over the flexible substrate to provide a continuous light emitting area. First and second conductors 24 and 26 are electrically connected to the electrodes 14 and 16 respectively. The first and second conductors are located on base 22 defined by a tab portion extending from or attached to rigid support 21 and extend beyond the flexible substrate 20 for providing electrical contact to the anode and cathode electrodes by an external power source (not shown). In applications where the OLED layer does not emit light from both sides of the flexible substrate 20, one or more of the support, substrate, cover, anode, or cathode may be opaque or reflective.

Alternatively, the flexible substrate 20 may be attached to the rigid support using adhesive or mechanical restraints such as clips, with the OLED layer facing away from the rigid support. In this arrangement, a transparent encapsulating cover 19 as shown in FIG. 1, is provided over the OLED layer. The encapsulating cover may be a separate element such as a hermetically sealed flexible cover-plate affixed over the layers 12, 14, and 16 or the cover may be coated over the layers 12, 14, and 16 as an additional layer. In this arrangement, the first and second conductors 24 and 26 can be located on a tab of the flexible substrate and extend beyond the encapsulating cover.

Referring to FIG. 2, the base 22 of the OLED light source 10 is adapted to be received by a socket 40 for connecting the OLED light source 10 to an external power source (such as a household electrical grid, not shown). Contacts 44 are provided in an aperture 42 in the socket 40 for contacting the conductors on the base 22 to supply power to the electrodes of the OLED. The base 22 and the aperture 42 may include complementary features such as a step to ensure that the base can be inserted in only one orientation into the socket aperture 42 so the base of the light source 10 cannot be inserted backwards into the socket.

The light source 10 may be physically inserted into or removed from the socket by pushing or pulling the light source into or out of the socket. The base 22 and the socket 40 are preferably provided with a detent (not shown) to hold the light source 10 in the socket Duplicate first electrical contacts 44' may be replicated in the aperture 42 so that the base 22 (assuming it does not include an orientation feature) may be inserted in either orientation into the aperture 42 and will still connect appropriately to the power source.

Figure 3:
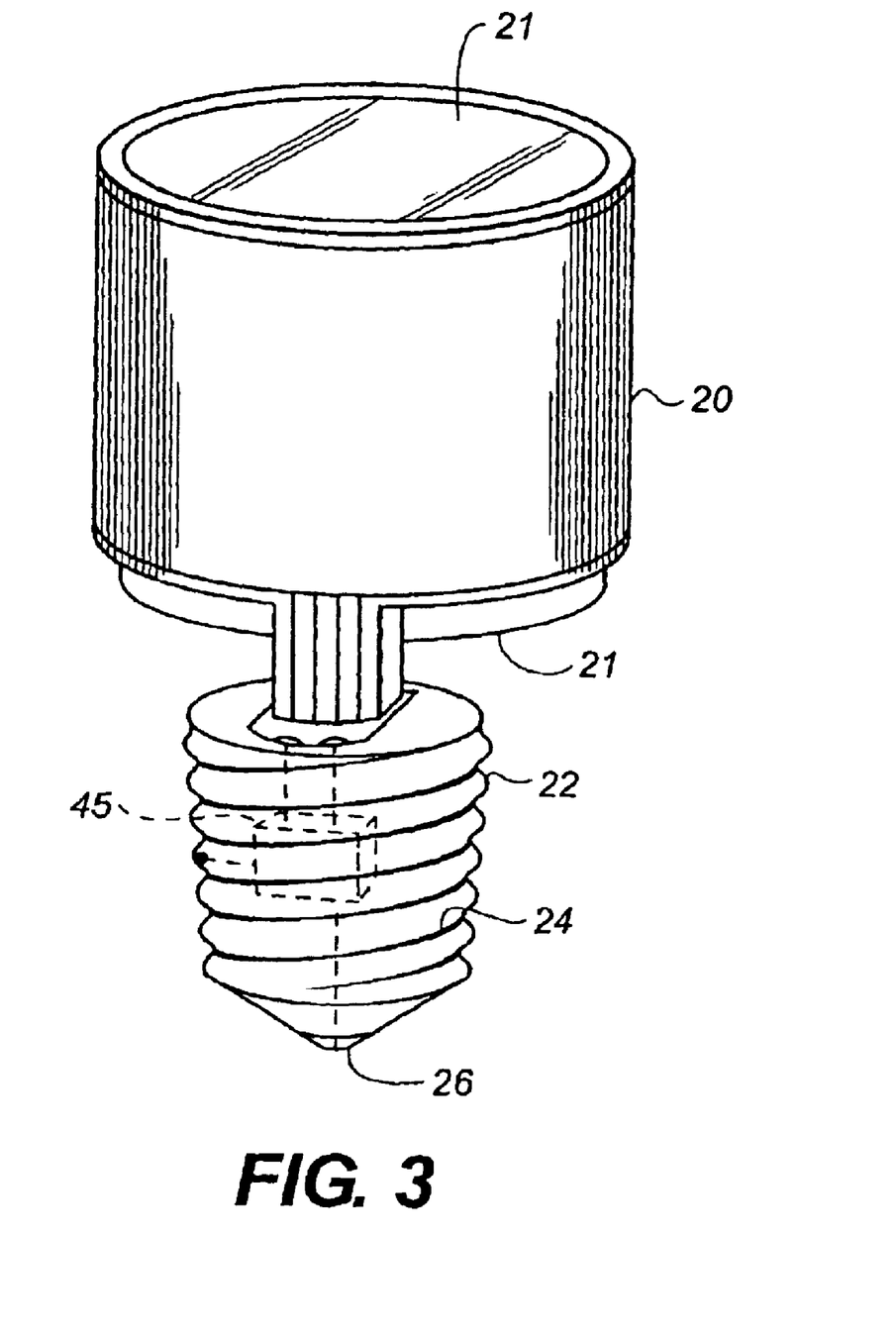
FIG. 3 is a perspective view of a light source according to an alternative embodiment of the present invention having a standard base.
Figure 4:
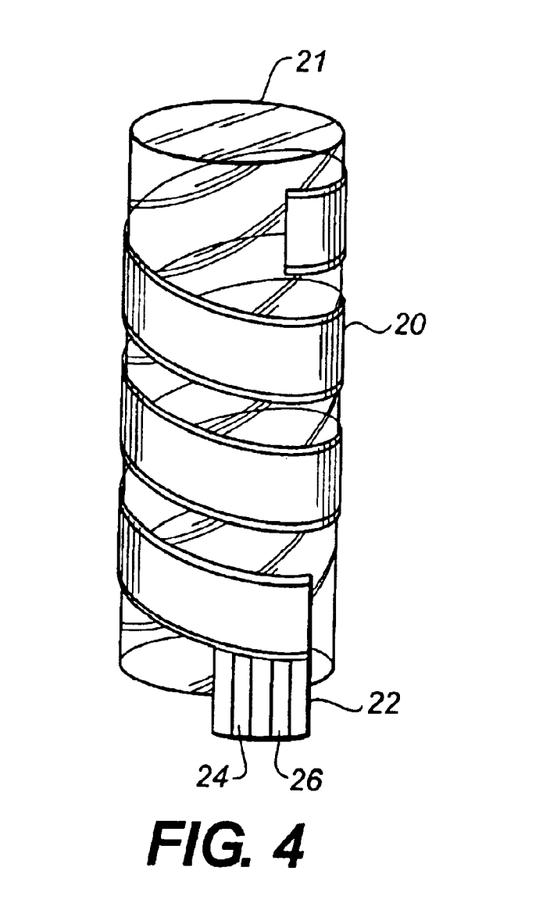
FIG. 4 is a perspective view of a light source according to an alternative embodiment of the present invention having spiral light emitting surface.
Figure 5:
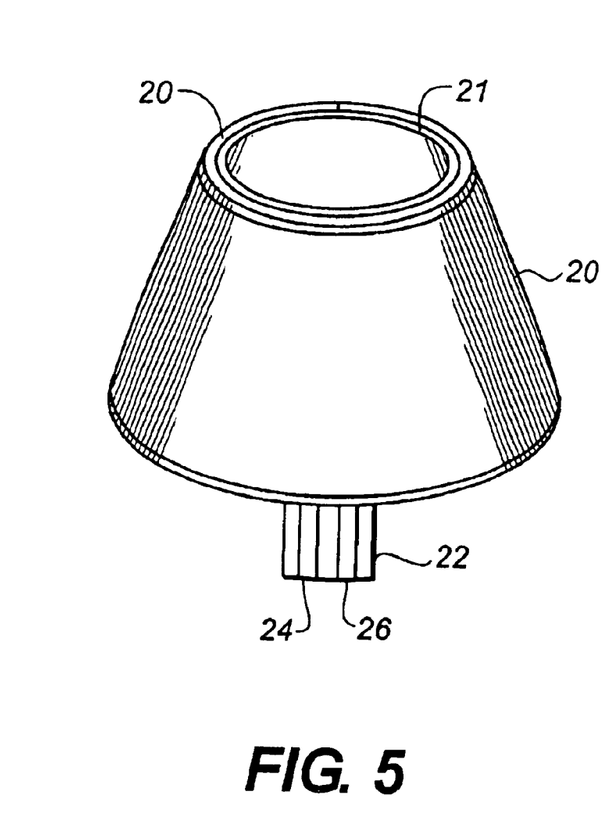
FIG. 5 is a perspective view of a light source according to an alternative embodiment of the present invention having a cone shaped light emitting surface.

Referring to FIGS. 3–5, the rigid support 21 may be curved to provide a three dimensional light emitting surface such as a cylinder (as shown in FIG. 3), a spiral (as shown in FIG. 4), or a conical surface (as shown in FIG. 5). Also, the base 22 can be in the form of a conventional base such as a standard US light bulb base (as shown FIG. 3), or a standard European base. The rigid support may be either a curved sheet, or a solid having a curved surface.

The curved surface may mimic the surfaces of conventional light bulbs or take the shape of a cylinder, spiral, or pyramid. Note that the flexible substrate is not necessarily rectangular when flat, and may have a complex shape to match the shape of the surface of the rigid support to which it is attached.

Figure 6:
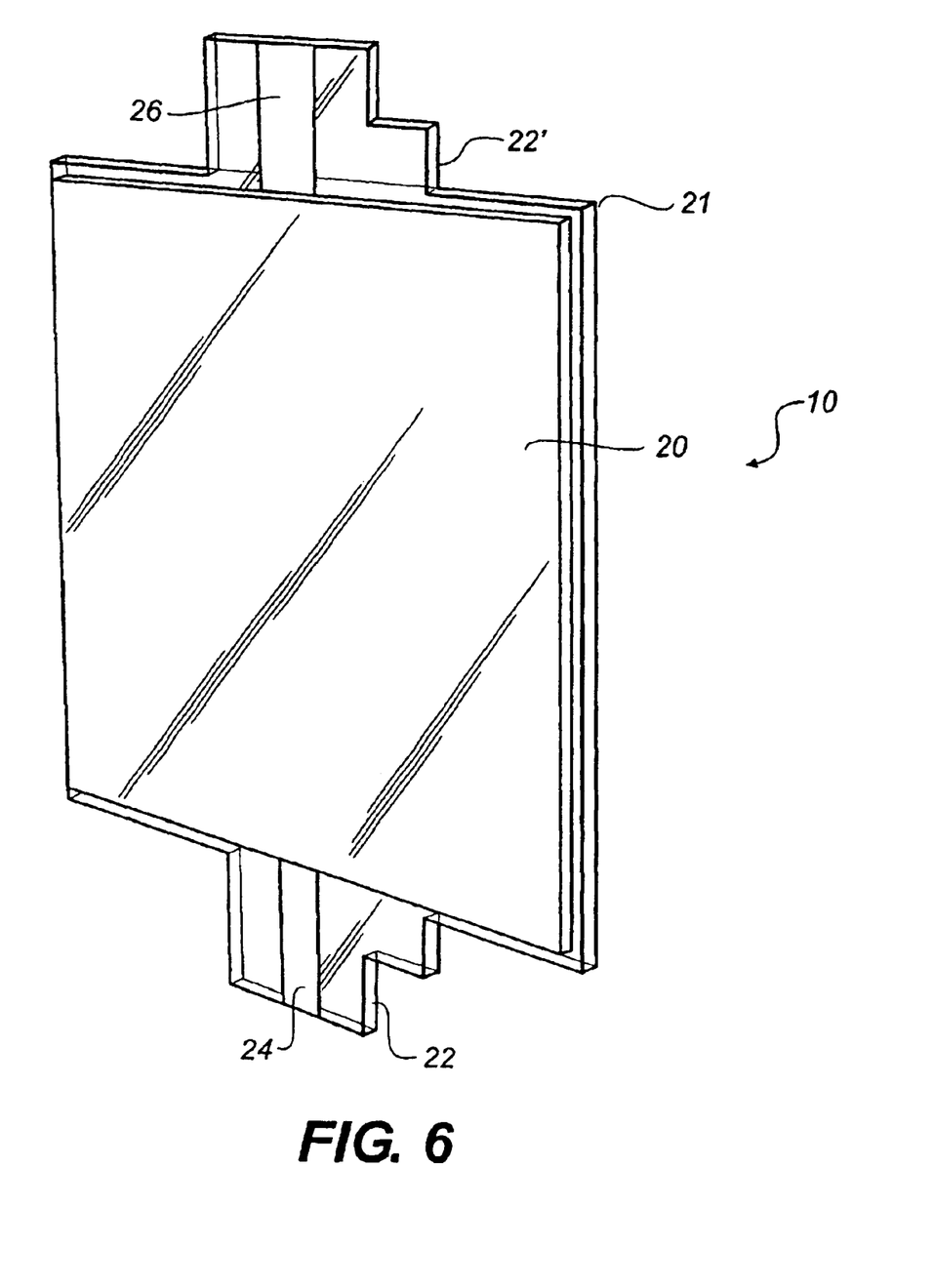
FIG. 6 is a perspective view of a light source according to an alternative embodiment of the present invention having bases located on opposite edges of the light source.

Referring to FIG. 6, the light source 10 defines two bases 22 and 22' located at opposite edges of the rigid support 21. One of the conductors 24 and 26 can be provided on each of the bases. Alternatively, both conductors can be provided on each base.

Figure 7:
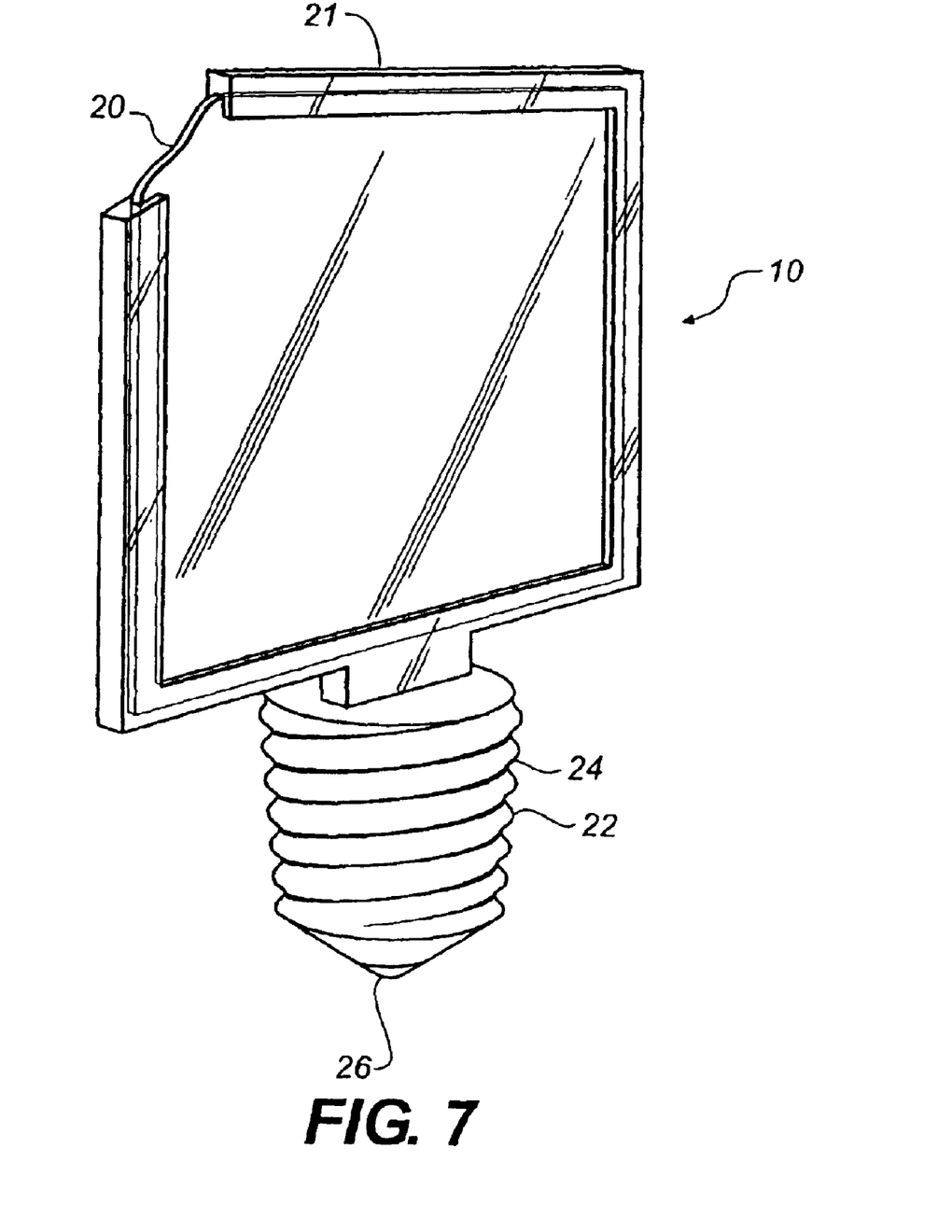
FIG. 7 is a perspective view of a light source according to the present invention wherein the support is a frame.

Referring to FIG. 7, the rigid support 21 may be a frame. The frame 21 holds the flexible substrate 20 in a desired configuration, such as a plane (as shown), or a cylinder. Base 22 is attached to the frame 21 and is electrically connected to the electrodes on the flexible substrate 20. The frame may be reflective or transparent to maximize the light output from the light source 10. The light source shown in FIG. 7 may be manufactured by first forming the OLED layer, electrode layers and encapsulating cover on the flexible substrate, and injection molding the frame around the periphery of the flexible substrate. The base includes conductors that are in electrical contact with the electrodes and be molded together with the frame.

Figure 8:
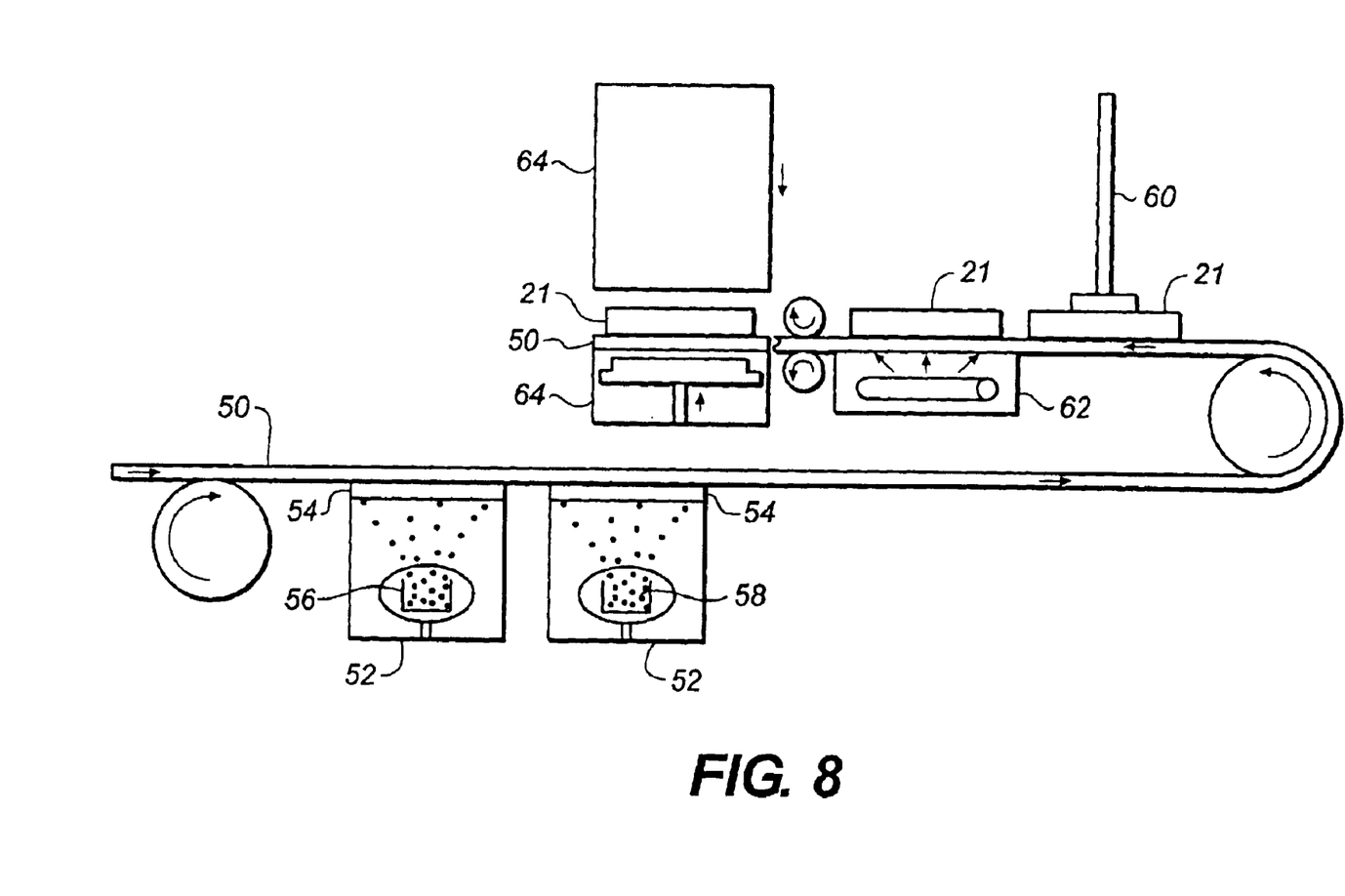
FIG. 8 is schematic diagram of a manufacturing process used to make a light source according to the present invention.

Referring to FIG. 8, the electrodes and OLED layer may be formed on the flexible substrate in a continuous process by providing a web of substrate material 50 in a roll that is sequentially advanced through a series of stations, including a plurality of material deposition stations 52. The deposition stations may include electrode deposition stations where a conductive materials 56 are applied, for example by sputtering through a mask 54 onto the substrate; OLED material deposition stations where OLED materials 58 are applied to the substrate, and other stations for applying other layers such as electrode protection layers, electrical connections and an encapsulating cover layer. The rigid support 21 is subsequently attached to the flexible substrate at a station 60. The rigid support may be provided with conductors and adhesives prior to attachment to the flexible substrate for example using printed circuit board techniques. The adhesives are then cured at a station 62 and the completed light source is cut from the continuous web at a die cutting station 64.

Referring to FIG. 3, light source 10 may include a power converter 45 for converting the electrical power from the external power source to a form suitable for powering the OLED light source 10. In a preferred embodiment, the external power source is a standard power source, for example, the power supplied to a house or office at 110 V in the United States or 220 V in the United Kingdom. Other standards such as 24 V DC, 12 V DC and 6 V DC found in vehicles, for example, may also be used.

The OLED light source 10 may require a rectified voltage with a particular waveform and magnitude; the converter 45 can provide the particular waveform using conventional power control circuitry. The particular waveform may periodically reverse bias the light emitting organic materials to prolong the life-time of the OLED materials. The converter 45 may be integrated into the base 22.

The flexible substrates 20 may be standardized and may be used with a variety of bases and converters for different national markets to provide advantages of manufacturing and marketing scale.

Because the organic light emitting materials emit light in all directions, the substrate 20 and/or encapsulating cover may be suitably treated to provide directional lighting. For example, the cover, substrate, or one of the electrodes may be provided with a reflective surface so that light emitted by the OLED layer will travel through the other surface and the device will emit light on only one side. Likewise, the external surface of the substrate or cover may be treated or modified to improve light output characteristics, for example by frosting to provide light diffusion.

Figure 9:
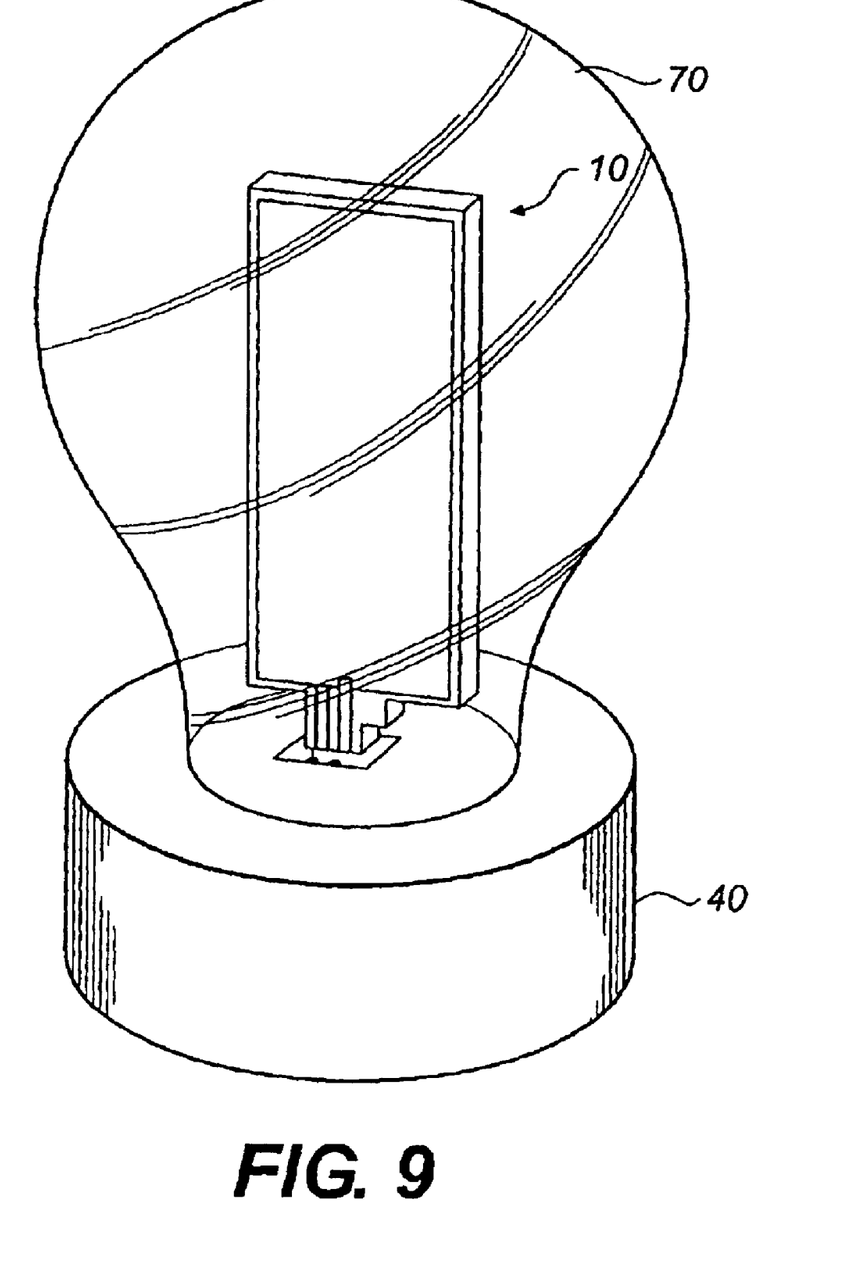
FIG. 9 is a perspective view of a light source having a housing.

Referring to FIG. 9, a transparent or translucent screen or housing 70 may be provided around the OLED light source 10 to diffuse the light and provide additional physical protection and aesthetic appeal. The housing may take a variety of shapes, for example the shape of a standard light bulb as shown.

The present invention may be employed in a wide variety of conventional applications, for example in a table-top lamp, floor-lamp, chandelier, under-counter lamp, or ceiling light. The present invention may also be employed in portable illumination devices using DC power sources.

In one embodiment, the Organic Light Emitting Diode (OLED) layer is composed of small molecule OLED material as disclosed in but not limited to U.S. Pat. No. 4,769,292, issued Sep. 6, 1988 to Tang et al., and U.S. Pat. No. 5,061,569, issued Oct. 29, 1991 to VanSlyke et al.

OLED Element Architecture

Figure 10:
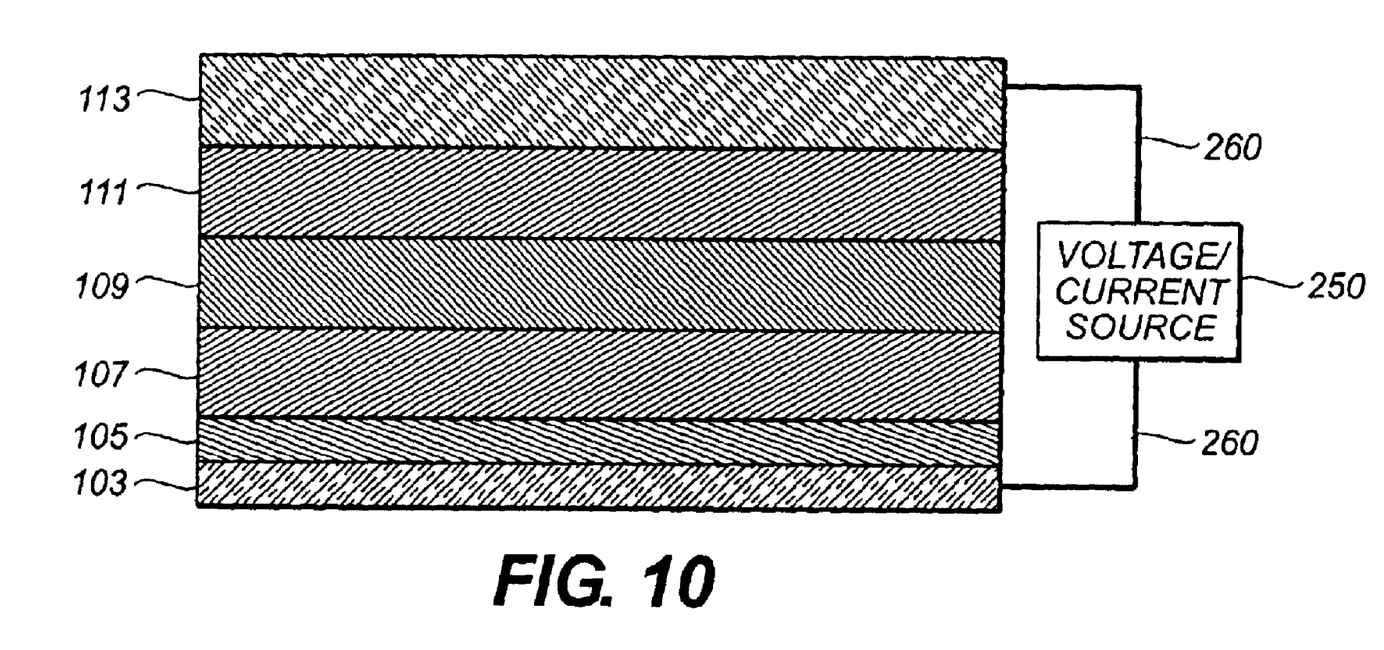
FIG. 10 is a cross sectional view of an area illumination light source used in a preferred embodiment of the present invention.

There are numerous configurations of OLED elements wherein the present invention can be successfully practiced. A typical, non-limiting structure is shown in FIG. 10 and is comprised of an anode layer 103, a hole-injecting layer 105, a hole-transporting layer 107, a light-emitting layer 109, an electron-transporting layer 111, and a cathode layer 113. These layers are described in detail below. The total combined thickness of the organic layers is preferably less than 500 nm. A voltage/current source 250 is required to energize the OLED element and conductive wiring 260 is required to make electrical contact to the anode and cathode. The TFT layers and associated wiring serve these functions.

Substrate

Substrate 20 is preferably light transmissive but may also be opaque. Substrates for use in this case include, but are not limited to, glass, plastic, semiconductor materials, ceramics, and circuit board materials.

Anode

The anode layer 103 is preferably transparent or substantially transparent to the light emitted by the OLED layer(s). Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. When the anode is not transparent, the light transmitting characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

It is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Illustrative of useful aromatic tertiary amines include, but are not limited to, the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl) amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Iridium complexes of phenylpyridine and its derivatives are particularly useful luminescent dopants. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,769,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar oxine derivatives constitute one class of useful host compounds capable of supporting electroluminescence, and are particularly suitable. Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-$\mu$-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Other classes of useful host materials include, but are not limited to: derivatives of anthracene, such as 9,10-di-(2-naphthyl)anthracene and derivatives thereof, distyrylatylene derivatives as described in U.S. Pat. No. 5,121,029, and benzazole derivatives, for example, 2, 2', 2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 111 and 109 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

Preferably, the cathode 113 is transparent and can comprise nearly any conductive transparent material. Alternatively, the cathode 113 may be opaque or reflective. Suitable cathode materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) and a thicker layer of conductive metal. The EIL is situated between the cathode and the organic layer (e.g., ETL). Here, the EIL preferably includes a low work function metal or metal salt, and if so, the thicker conductor layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When cathode layer 113 is transparent or nearly transparent, metals must be thin or transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357). While all organic layers may be patterned, it is most common that only the layer emitting light is patterned, and the other layers may be uniformly deposited over the entire device.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the device, providing a polarizing medium over the device, or providing colored, neutral density, or color conversion filters over the device. Filters, polarizers, and anti-glare or anti-reflection coatings may be specifically provided over the cover or as part of the cover.

The invention has been described in detail with particular reference to certain preferred embodiments thereof, but it will be understood that variations and modifications can be effected within the spirit and scope of the invention.

PARTS LIST

- 10 OLED light source
- 12 organic light emitting layer
- 14 cathode
- 16 anode
- 18 power source
- 20 substrate
- 21 rigid support
- 22 base
- 22' base
- 24 first conductor
- 26 second conductor
- 40 socket
- 42 aperture
- 44 contacts
- 44' contacts
- 45 power converter
- 50 web
- 52 material deposition station
- 54 mask
- 56 conductive material
- 58 OLED material
- 60 attachment station
- 62 curing station
- 64 die cutting station
- 70 transparent housing
- 103 anode
- 105 hole-injecting layer
- 107 hole-transporting layer
- 109 light-emitting layer
- 111 electron-transporting layer
- 113 cathode layer
- 250 voltage/current source
- 260 conductive wiring

What is claimed is:

1. A solid-state area illumination light source, comprising:
   a) a rigid support;
   b) a flexible substrate attached to the rigid support;
   c) an organic light emitting diode (OLED) layer deposited on the flexible substrate, the organic light emitting diode layer including first and second electrodes for providing electrical power to the OLED layer;
   d) an encapsulating cover covering the OLED layer;
   e) first and second conductors electrically connected to the first and second electrodes, and extending beyond the encapsulating cover for making electrical contact to the first and second electrodes by an external power source; and
   f) a base connected to the rigid support, the base being adapted to be removably received by a socket and having first electrical contacts for making electrical connection to the first and second conductors of the light source, and second electrical contacts for making electrical connection to conductors in the socket thereby providing an area illumination light source compatible with existing lighting infrastructure.

2. The light source claimed in claim 1, wherein the support is a frame.

3. The light source claimed in claim 1, wherein the support is a rigid sheet coextensive with the flexible substrate.

4. The light source claimed in claim 1, wherein the rigid support holds the flexible substrate in a flat plane.

5. The light source claimed in claim 1, wherein the rigid support holds the flexible substrate in a curved configuration.

6. The light source claimed in claim 5, wherein the curved configuration is cylindrical, spiral, or conical.

7. The light source claimed in claim 1, wherein the base comprises one or more tab portions extending from the rigid support, the first and second conductors being located on the tab portion(s).

8. The light source claimed in claim 7, wherein the tab portion(s) include an orientation feature for orienting the light source in a socket.

9. The light source claimed in claim 7, wherein the first and second conductors are located on both sides of the tab portion(s), whereby the light source can be inserted into a socket in either of two orientations.

10. The light source claimed in claim 7, wherein the tab portions are located at opposite edges of the substrate.

11. The light source claimed in claim 1, wherein the light source emits light from one side and the base is located on an opposite side of the light source.

12. The light source claimed in claim 1, wherein the encapsulating cover is a coated layer.

13. The light source claimed in claim 1, wherein the encapsulating cover is a hermetically sealed cover plate.

14. The light source claimed in claim 1, wherein the OLED layer is continuous over the substrate.

15. The light source claimed in claim 1, wherein the light source operates on standard power.

16. The light source claimed in claim 15, wherein the standard power is elected from the group consisting of 110 volt AC, 220 volt AC, 24 volt DC, 12 volt DC, and 6 volt DC.

17. The light source claimed in claim 1, wherein the support is transparent and light is emitted through the support.

18. The light source claimed in claim 1, wherein the rigid support also functions as the encapsulating cover.

19. The light source claimed in claim 1, wherein the rigid support is transparent.

20. The light source claimed in claim 1, further comprising a transparent or translucent housing surrounding the support.

21. The light source claimed in claim 20, wherein the housing has the shape of a standard light bulb.

22. The light source claimed in claim 1, wherein the base is adapted to be received by and make electrical contact with a standard light socket.

23. The light source claimed in claim 1, further comprising: a converter connected to the first and second conductors far converting power from an external power source to a form useable by the OLED layer.

24. The light source claimed in claim 23, wherein the base is adapted to be received by and make electrical contact with a standard light socket, and wherein the converter is located in the base.

25. The light source claimed in claim 24, wherein the converter converts AC line voltage to a voltage useable by the OLED layer.

26. The light source claimed in claim 22, wherein the standard light socket is an American style screw in light bulb contact or a European style bayonet pin-type light bulb contact.

27. The light source claimed in claim 3, wherein the rigid support is reflective.

\* \* \* \* \*